US006856555B2

United States Patent
Fujimoto

(10) Patent No.: US 6,856,555 B2
(45) Date of Patent: Feb. 15, 2005

(54) LEAK IMMUNE SEMICONDUCTOR MEMORY

(75) Inventor: Yukihiro Fujimoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/745,518

(22) Filed: Dec. 29, 2003

(65) Prior Publication Data

US 2004/0190351 A1 Sep. 30, 2004

(30) Foreign Application Priority Data

Mar. 24, 2003 (JP) .................................... P2003-080390

(51) Int. Cl.[7] ................................................. G11C 7/00
(52) U.S. Cl. .................. 365/189.07; 365/154; 365/156
(58) Field of Search ........................... 365/189.07, 154, 365/206, 156

(56) References Cited

U.S. PATENT DOCUMENTS 4,879,690 A * 11/1989 Anami et al. .......... 365/189.07
5,805,508 A * 9/1998 Tobita ................... 365/189.07
5,986,940 A * 11/1999 Atsumi et al. ......... 365/189.07
6,522,594 B1 * 2/2003 Scheuerlein ................ 365/206

OTHER PUBLICATIONS

Ken'ichi Agawa, et al., "A Bitline Leakage Compensation Scheme for Low–Voltage SRAMs", IEEE Jornal of Solid- –State Circuits, vol. 36, No. 5, May 2001, pp. 726–734.

* cited by examiner

Primary Examiner—Huan Hoang
(74) Attorney, Agent, or Firm—Oblon, Spivak, McClelland, Maier & Neustadt, P.C.

(57) ABSTRACT

A semiconductor memory has word lines, bit lines, memory cells configured to store signals by transition states of transistors and configured to provide the bit lines with the signals addressed by the word lines, a leak detecting line, leak generators configured to provide the leak detecting line with a leakage current and a signal compensator configured to detect a voltage state of the leak detecting line and to change the signals transmitted by the bit lines.

11 Claims, 15 Drawing Sheets

LEAK IMMUNE SEMICONDUCTOR MEMORY

CROSS REFERENCE TO RELATED APPLICATIONS

This application is based upon and claims the benefit of priority from prior Japanese Patent Application P 2003-80390 filed on Mar. 24, 2003; the entire contents of which are incorporated by reference herein.

BACKGROUND OF THE INVENTION

1. Field of the Invention

The present invention relates to a semiconductor memory and in particular to a static random access memory (SRAM).

2. Description of the Related Art

A SRAM has recently became widespread as a cache memory coupling a central processing unit (CPU) to a dynamic random access memory (DRAM) in order to accelerate data transfer within a system-on-chip. As memory devices continue to shrink in size over time, so do the individual memory cells and hence the individual devices such as transistors within the memory cells. A problem associated with SRAM device miniaturization occurs. Off-state-leakage currents may generate in transfer transistors within the memory cells that are not accessed to read signals: The off-state-leakage currents may cause a wrong signal transmission in the memory devices.

An existing method for dealing with the off-state-leakage currents within the memory cells is to break current paths including the bit lines where leakage currents generate as disclosed in published Japanese Patent Application H11-16367. However, many memory cells are not available by breaking the bit lines generating the leakage currents. Since 256 memory cells are generally connected to a single bit line, a large number of the memory cells are not available when the leakage currents generate in a plurality of bit lines.

SUMMARY OF THE INVENTION

An aspect of present invention inheres in a semiconductor memory according to an embodiment of the present invention comprising a plurality of word lines, a plurality of bit lines arranged perpendicular to the word lines, a plurality of memory cells arranged in a matrix corresponding to a plurality of cross points of the word lines and the bit lines, and configured to store signals by transition states of transistors, and configured to provide the bit lines with the signals addressed by the word lines, a leak detecting line arranged parallel to the bit lines, a plurality of leak generators configured to provide the leak detecting line with a leakage current, and a signal compensator configured to detect a potential of the leak detecting line, and to change the signals transmitted by the bit lines.

DETAILED DESCRIPTION OF THE INVENTION

Figure 1:
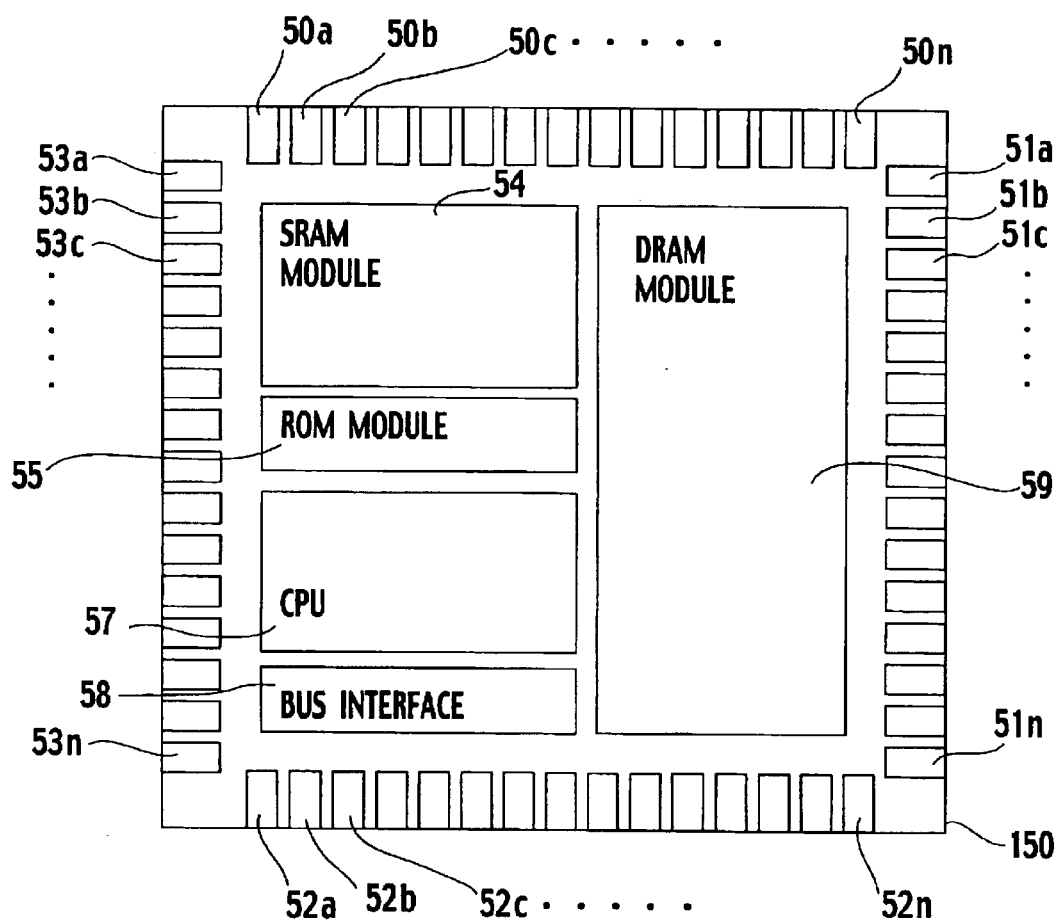
FIG. 1 is a diagram of a system-on-chip in accordance with a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

With reference to FIG. 1, a system-on-chip in accordance with a first embodiment of the present invention has a substrate 150, an SRAM module 54 embedded on the substrate 150, a DRAM module 59 embedded on the substrate 150, a read only memory (ROM) module 55 embedded on the substrate 150, a CPU 57 embedded on the substrate 150, a bus interface 58 embedded on the substrate 150 and bonding pads 50a through 50n, 51a through 51n, 52a through 52n and 53a through 53n located around the perimeter of the substrate 150.

The SRAM module 54 couples the CPU 57 to the DRAM module 59. The ROM 55 stores programs to control the CPU 57. The bus interface 58 controls a signal interface between the system-on-chip and peripherals. The bonding pads 50a–50n, 51a–51n, 52a–52n and 53a–53n are metallic films to which electrical leads may be connected.

Figure 2:
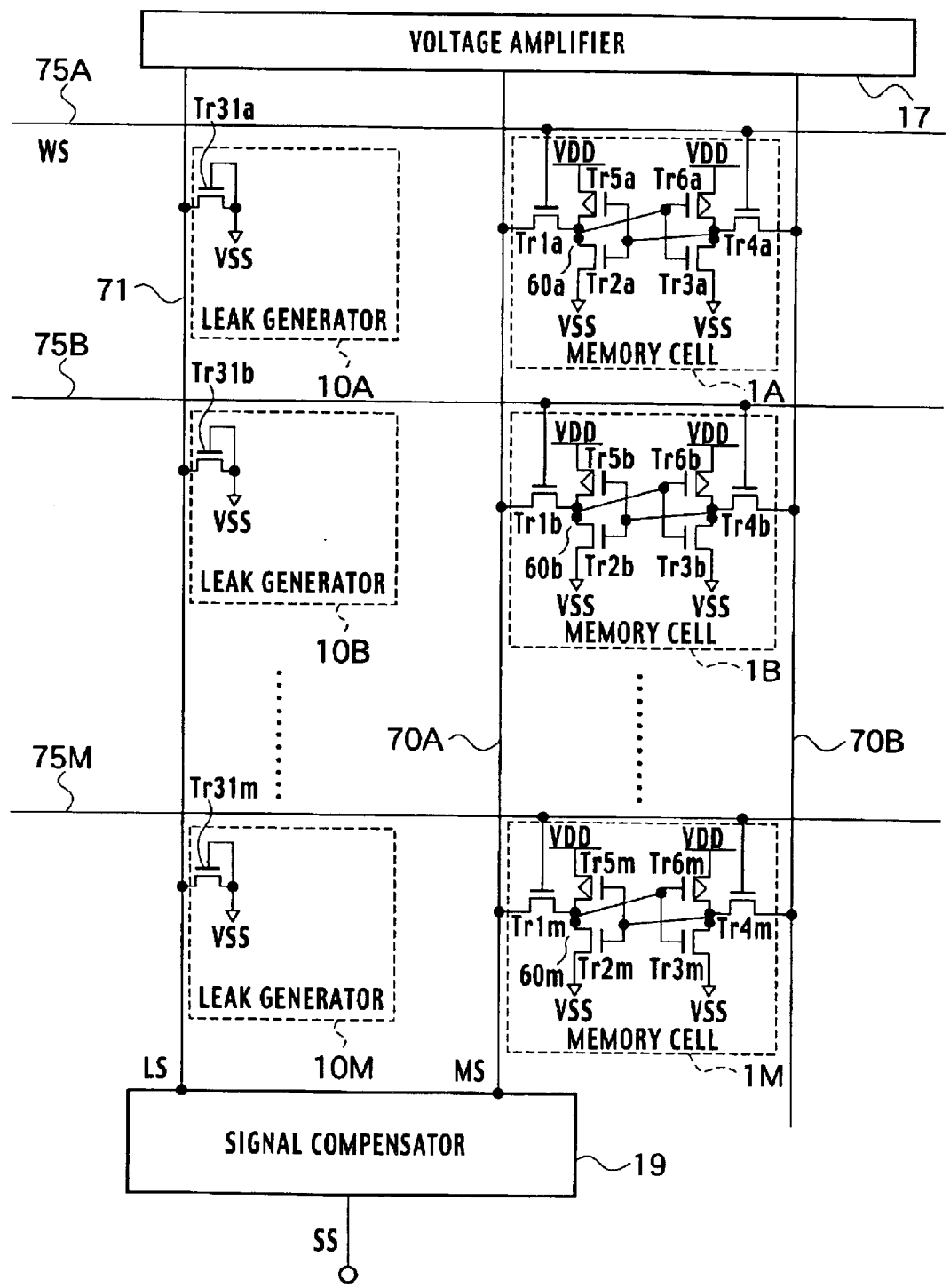
FIG. 2 is a circuit diagram of a leak immune semiconductor memory in accordance with the first embodiment of the present invention.

With reference now to FIG. 2, a leak immune semiconductor memory included in the SRAM module 54 shown in FIG. 1 is illustrated. The leak immune semiconductor memory in accordance with the first embodiment has a plurality of word lines 75A through 75M, a first bit line 70A and a second bit line 70B arranged perpendicular to the word line 75A–75M, a plurality of memory cells 1A through 1M addressed by the word lines 75A–75M to transmit signals to the first bit line 70A and the second bit line 70B, a leak detecting line 71 arranged parallel to the first bit line 70A, a plurality of leak generators 10A through 10M providing leakage currents to the leak detecting line 71, and a signal compensator 19 receiving a leak signal (LS) transferred by the leak detecting line 71 and a memory signal (MS) transferred by the first bit line 70A and transmitting an output signal (SS)

The leak generators 10A through 10M have leak generating transistors Tr31a through Tr31m respectively. Each of the leak generating transistors Tr31a through Tr31m is an nMOS transistor. In addition, the leak generating transistor Tr31a in the leak generator 10A is a diode-connected transistor of which a source region and a gate are short-circuited and electrically connected to a low level voltage supply VSS, or the ground level. Therefore, the leak generating transistor Tr31a is held at an off state. Further, a drain region of the leak generating transistor Tr31a is electrically connected to the leak detecting line 71. Each of the other leak generators 10B–10M has a circuit similar to the leak generator 10A. Each of the leak generators 10A–10M provides the off-state-leakage current generated in the leak generating transistors Tr31a–Tr31m to the leak detecting line 71, which pulls down the leak detecting line 71 to a negative state.

A plurality of memory cells 1A–1M are electrically connected to the first bit line 70A and the second bit line 70B. The memory cells 1A–1M have first transfer transistors Tr1a–Tr1m of which each drain region is electrically connected to the first bit line 70A, second transfer transistors Tr4a–Tr4m of which each drain region is electrically connected to the second bit line 70B, first load elements Tr5a–Tr5m of which each drain region is electrically connected to each source region of the first transfer transistors Tr1A–Tr1m, first drive-transistors Tr2a–Tr2m of which each drain region is electrically connected to each source region of the first transfer transistors Tr1a–Tr1m, second load elements Tr6b–Tr6m of which each drain region is electrically connected to each source region of the second transfer transistors Tr4b–Tr4m, and second drive-transistors Tr3a–Tr3m of which each drain region is electrically connected to each source region of the second transfer transistors Tr4a–Tr4m respectively. The first transfer transistors Tr1a–Tr1m, the second transfer transistors Tr4a–Tr4m, the first drive-transistors Tr2a–Tr2m and the second drive-transistors Tr3a–Tr3m are the nMOS transistors. The first load elements Tr5a–Tr5m and the second load elements Tr6a–Tr6m are pMOS transistors. In FIG. 2, each point where each source region of the first transfer transistors Tr1a–Tr1m and each drain region of the first load elements Tr5a–Tr5m and each drain region of the first drive-transistors Tr2a–Tr2m are connected is defined as a node 60a through 60m. Those of ordinary skilled in the art will appreciate that the drain and the source can be exchanged in each of the first transfer transistors Tr1a–Tr1m and the second transfer transistors Tr4a–Tr4m.

In the memory cell 1A, a source region of the first load element Tr5a and the second load element Tr6a are electrically connected to a high level voltage supply VDD. In addition, a source region of the first drive-transistor Tr2a and the second drive-transistor Tr3a are electrically connected to the low level voltage supply VSS. The gate of the first drive-transistor Tr2a and the gate of the first load element Tr5a are connected to each other to serve as an input of CMOS inverter. Similarly, the gate of the second drive-transistor Tr3a and the second load element Tr6a are connected to each other to serve as the input of the CMOS inverter. An output of the CMOS inverter having the first load element Tr5a and the first drive-transistor Tr2a is electrically connected to the source region of the first transfer transistor Tr1a and transmits a feedback signal to the input of the CMOS inverter having the second load element Tr6a and the second drive-transistor Tr3a. Similarly, the output of the CMOS inverter having the second load element Tr6a and the second drive-transistor Tr3a is electrically connected to the source region of the second transfer transistor Tr4a and transmits the feedback signal to the input of the CMOS inverter having the first load element Tr5a and the first drive-transistor Tr2a. The gate of the first transfer transistor Tr1a and the gate of the second transfer transistor Tr4a are electrically connected to word line 75A respectively. The first transfer transistor Tr1a and the second transfer transistor Tr4a are controlled by a word line voltage (WS). Each of the other memory cells 1B–1M is similar to the memory cell 1A.

The leak detecting line 71, the first bit line 70A and the second bit line 70B are equivalent in parasitic capacitance. The number of leak generators 10A–10M is substantially equal to the number of memory cells 1A–1M. For example, 256 leak generators 10A–10M are connected to single leak detecting line 71. In addition, the area of each gate of the leak generating transistors Tr31a–Tr31m is 1.5–3 times or desirably twice as large as the area of each gate of the first transfer transistors Tr1a–Tr1m and the second transfer transistors Tr4a–Tr4m.

Figure 3:
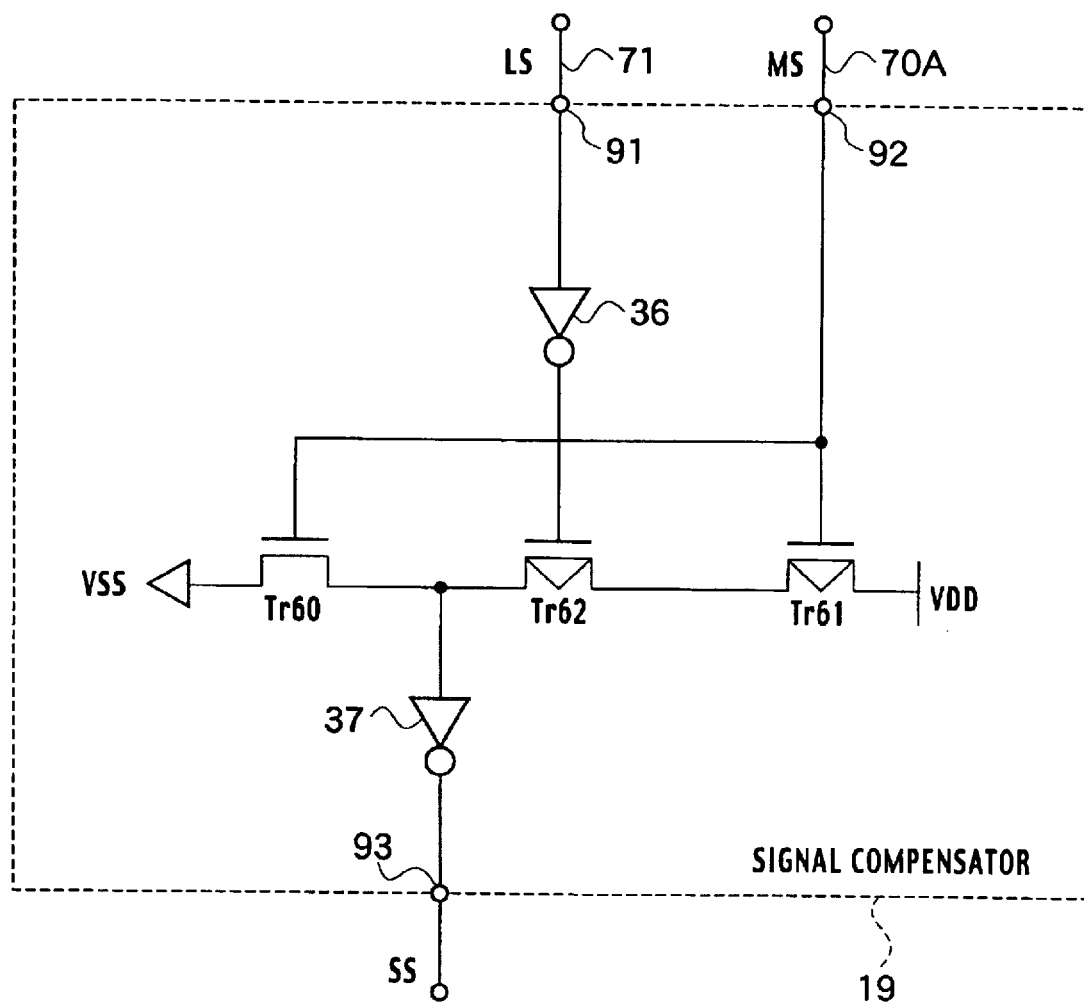
FIG. 3 is a circuit diagram of a signal compensator of the leak immune semiconductor memory in accordance with the first embodiment of the present invention.

With reference to FIG. 3, a circuit example of the signal compensator 19 shown in FIG. 2 is illustrated. The signal compensator 19 has a first inverter 36 receiving the leak signal (LS) transferred from the leak detecting line 71, a first switching transistor Tr61 controlled by the memory signal (MS) transferred from the bit line 70A of which the source region is connected to the high level voltage supply VDD, a second switching transistor Tr62 controlled by a signal transferred from the first inverter 36 of which the source region is connected to the drain region of the first switching transistor Tr61, a third switching transistor Tr60 controlled by a signal MS transferred from bit line 70A of which the drain region is connected to the drain region of the second switching transistor Tr62, and a second inverter 37 connected to the drain region of the third switching transistor Tr60.

The first bit line 70A shown in FIG. 2 is electrically connected to an input terminal 92 of the signal compensator 19 as shown in FIG. 3. The input terminal 92 is electrically connected to the gate of the first switching transistor Tr61 and the gate of the third switching transistor Tr60. The leak detecting line 71 shown in FIG. 2 is electrically connected to an input terminal 91 of the signal compensator 19 as shown in FIG. 3 and the input terminal 91 is electrically connected to the first inverter 36. The second inverter 37 is electrically connected to an output terminal 93. The output terminal 93 transmits the output signal (SS) generated by the signal compensator 19. The first switching transistor Tr61 and the second switching transistor Tr62 are pMOS transistors, and the third switching transistor Tr60 is an nMOS transistor.

The principle to prevent the first bit line 70A from wrong or incorrect signal transmitting within the leak immune semiconductor memory shown in FIG. 2 depends on the electric state of each of the nodes 60a–60m and the existence of an off-state-leakage current generated in each of the first transfer transistors Tr1a–Tr1m and the leak generating transistors Tr31a–Tr31m. Therefore, behavior of the leak immune semiconductor memory when the memory cell 1A is accessed and other memory cells 1B–1M are not accessed is explained below both in the case that the off-state-leakage current is generated and in the case that the off-state-leakage current is not generated. A high voltage ("H" level) signal or a low voltage ("L" level) signal is stored in the node 60*a* of the memory cell 1A.

Figure 4:
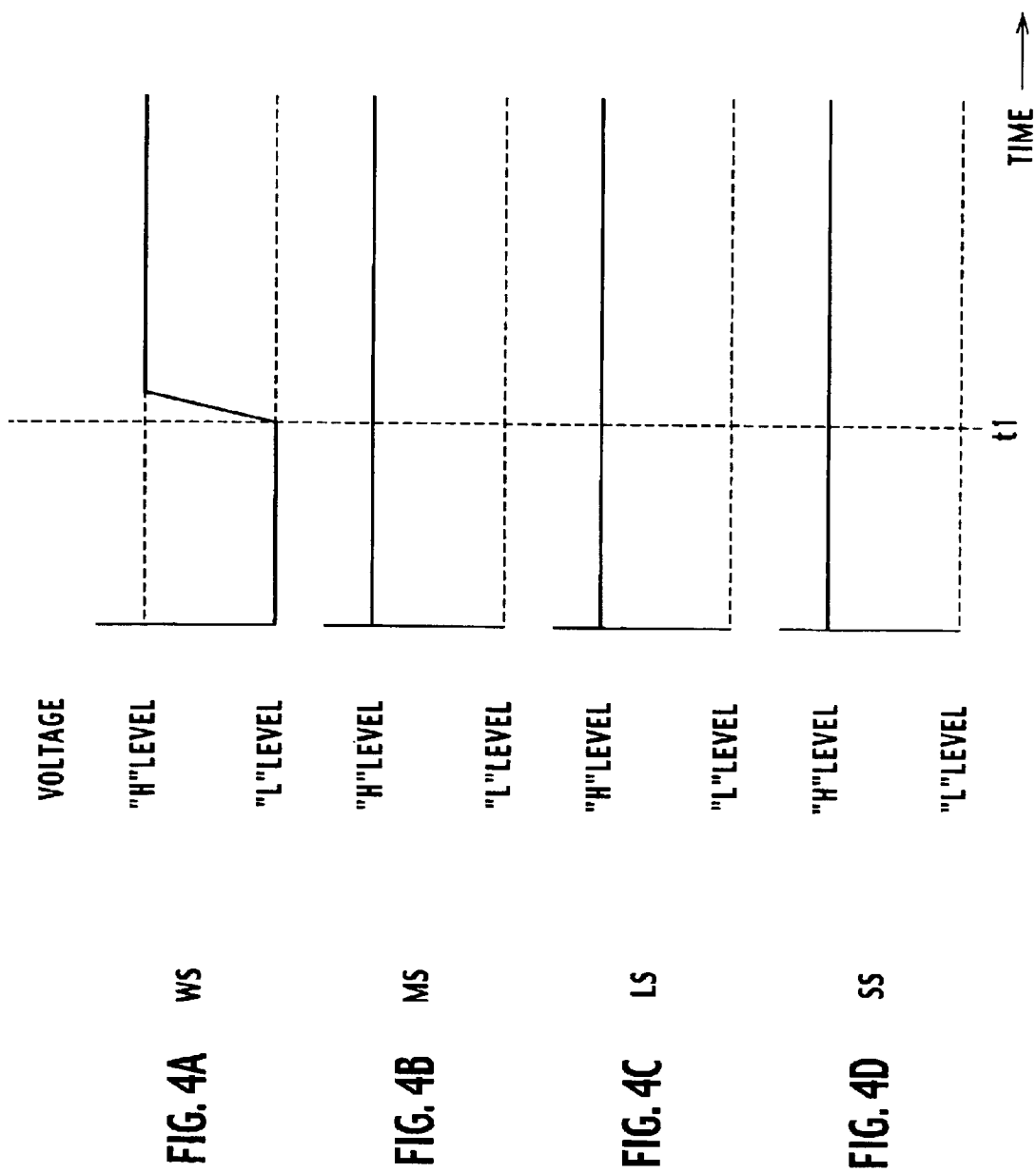
FIG. 4A, FIG. 4B, FIG. 4C, FIG. 4D, FIG. 5A, FIG. 5B, FIG. 5C, FIG. 5D, FIG. 6A, FIG. 6B, FIG. 6C and FIG. 6D are graphs that illustrate voltage states of wires in accordance with the first embodiment of the present invention.

(A) In the case where the "H" level signal is stored and the off-state-leakage current is not generated:

(a) With reference now to FIG. 4A, the high voltage is applied to the word line 75A at time "t1". Consequently, the state of first transfer transistor Tr1*a* within the memory cell 1A electrically connected to the word line 75A goes from an off state to an on state.

(b) The voltage amplifier 17 applies high voltage to the first bit line 70A. Since the first transfer transistor Tr1*a* is in an on state, the "H" level signal is transmitted to the bit line 70A from the memory cell 1A.

(c) In the case where the off-state-leakage current is not generated in each of the first transfer transistors Tr1*b*–Tr1*m* within the memory cells 1B–1M, the first bit line 70A transfers an "H" level of a memory signal (MS) to the signal compensator 19 as shown in FIG. 4B.

(d) In the case where the off-state-leakage current is not generated in each of the leak generating transistors Tr31*a*–Tr31*m*, the leak detecting line 71 also transfers an "H" level of leak signal (LS) charged by the voltage amplifier 17 to the signal compensator 19 as shown in FIG. 4C.

(e) By receiving the memory signal (MS) and the leak signal (LS), the first switching transistor Tr61 shown in FIG. 3 is in an off state, each of the second switching transistor Tr62 and the third switching transistor Tr60 is in an on state. Therefore, the signal compensator 19 transmits a "H" level of the output signal (SS) as shown in FIG. 4D.

Figure 5:
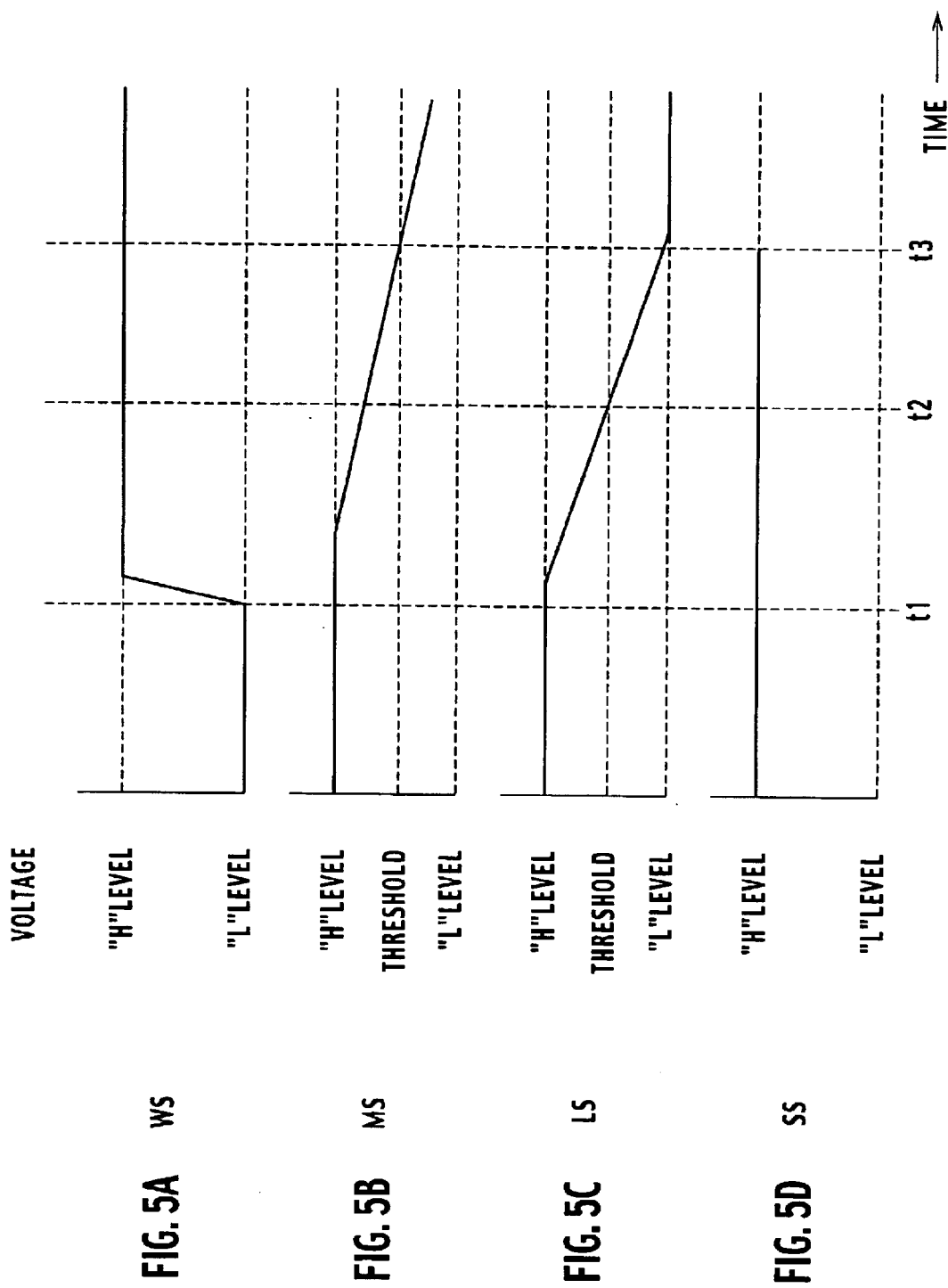

(B) In the case where the "H" level signal is stored and the off-state-leakage current is generated:

(a) With reference now to FIG. 5A, the "H" level voltage is applied to the word line 75A at time "t1". Consequently, the first transfer transistor Tr1*a*, in which the gate is electrically connected to the word line 75A shown in FIG. 2, goes from the off state to the on state.

(b) The voltage amplifier 17 applies the high voltage to the first bit line 70A. In addition, the memory cell 1A transmits an "H" level signal to the first bit line 70A since the first transfer transistor Tr1*a* is in the on state.

(c) In the case that the off-state-leakage current generates in each of the first transfer transistors Tr1*b*–Tr1*m* within the non-accessed memory cells 1B–1M, the off-state-leakage current pulls down the first bit line 70A to a negative state. Therefore, the memory signal (MS) transmitted to the signal compensator 19 by the first bit line 70A is transferred from the "H" level to the "L" level as shown in FIG. 5B.

(d) Where the off-state-leakage current is generated in each of the leak generating transistors Tr31*a*–Tr31*m*, the leak generators 10A–10M pull down the leak detecting line 71 to a negative state, even though the voltage amplifier 17 applies a high voltage to the leak detecting line 71. Therefore, the leak signal (LS) transmitted by the leak detecting line 71 is transferred from the "H" level to the "L" level as shown in FIG. 5C.

(e) The area of each gate of the leak generating transistors Tr31*a*–Tr31*m* is larger than the area of each gate of the transfer transistors Tr1*a*–Tr1*m* within the memory cell 1A–1M. Therefore, a gate threshold voltage of each of the leak generating transistors Tr31*a*–Tr31*m* is lower than a gate threshold voltage of each of the first transfer transistors Tr1*a*–Tr1*m*. Consequently, the leak signal (LS) transmitted by the leak detecting line 71 reaches the "L" level threshold at time "t2" faster than the memory signal (MS) transmitted by the first bit line 70A as shown in FIG. 5B and FIG. 5C.

(f) The signal compensator 19 receives the "H" level of memory signal (MS) and the "L" level of leak signal (LS) from time "t2" to time "t3" when the voltage of memory signal (MS) reaches the "L" level threshold. In this case, the first switching transistor Tr61 and the second switching transistor Tr62 are in the off states and the third switching transistor Tr60 is in the on state in the signal compensator 19 shown in FIG. 3. Therefore, the signal compensator 19 shown in FIG. 2 transmits the "H" level of output signal (SS) until time "t3" as shown in FIG. 5D.

(g) After time "t3", the signal compensator 19 shown in FIG. 2 receives the "L" level of memory signal (MS) and the "L" level of leak signal (LS) In this case, the first switching transistor Tr61 is in the on state, and the second switching transistor Tr62 and the third switching transistor Tr60 within the signal compensator 19 shown in FIG. 3 are in the off states. Therefore, the signal compensator 19 shown in FIG. 2 does not transmit the output signal (SS) after time "t3" as shown in FIG. 5D.

Figure 6:
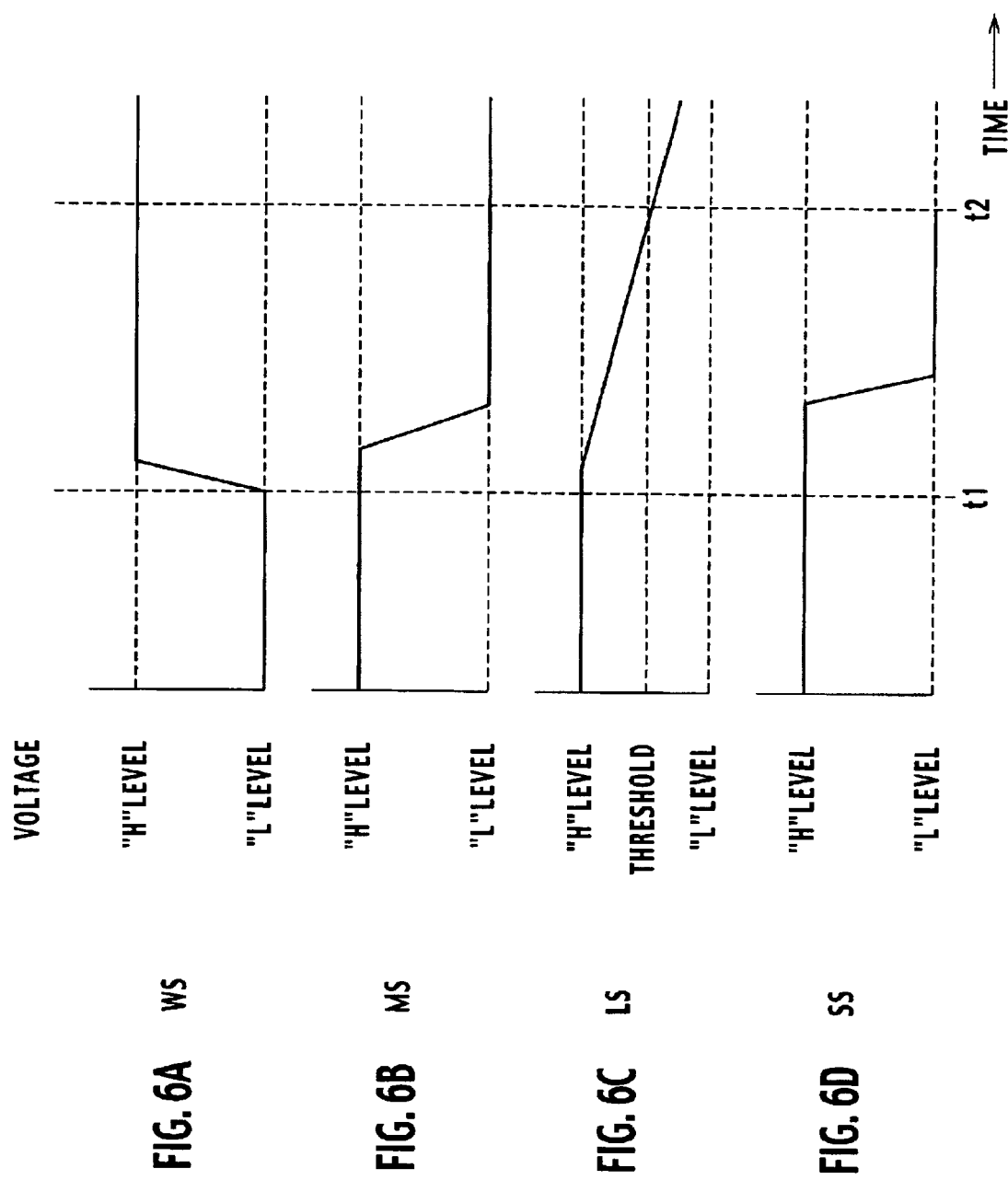

(C) In case that the "L" level signal is stored in the node 60*a* and the off-state-leakage current is generated:

(a) The high voltage is applied to the word line 75A at time "t1" as shown in FIG. 6A. Consequently, the first transfer transistor Tr1*a* of which the gate is electrically connected to the word line 75A goes from the off state to the on state within the memory cell 1A shown in FIG. 2.

(b) The high voltage is applied to the first bit line 70A by the voltage amplifier 17. However, the memory cell 1A pulls the first bit line 70A low state since the first transfer transistor Tr1*a* within the memory cell 1A is in the on state. Therefore, the first bit line 70A transfers the "L" level of memory signal (MS) to the signal compensator 19 as shown in FIG. 6B.

(c) In the case that the off-state-leakage currents generate in the leak generating transistors Tr31*a*–Tr31*m*, the leak generators 10A–10M pull down the leak detecting line 71 to a negative state. Therefore, the leak signal (LS) transmitted to the signal compensator 19 by the leak detecting line 71 switches from the "H" level to the "L" level as shown in FIG. 6C.

(d) The first switching transistor Tr61 and the second switching transistor Tr62 are in the on states and the third switching transistor Tr60 is in the off state within the signal compensator 19 shown in FIG. 3 until the voltage of leak signal (LS) transmitted to the signal compensator 19 by the leak detecting line 71 reaches the "L" level threshold at time "t2" as shown in FIG. 6C. Therefore, the signal compensator 19 shown in FIG. 2 transmits the "L" level signal until time "t2" as shown in FIG. 6D.

(e) After time "t2", the signal compensator 19 shown in FIG. 2 receives the "L" level of memory signal (MS) and the "L" level of leak signal (LS). Therefore, the first switching transistor Tr61 is in the on state and the second switching transistor Tr62 and the third switching transistor Tr60 are in the off states within the signal compensator 19 shown in FIG. 3. Consequently, the signal compensator 19 does not transmit the output signal (SS) after time "t2" as shown in FIG. 6D.

As described above, the semiconductor memory in accordance with the first embodiment prevents a fault output signal. Even if the accessed memory cell 1A stores an "H" level signal, the memory signal (MS) transmitted by the first bit line 70A is transferred from the "H" level to the "L" level by the off-state-leakage currents generated in the first transfer transistors Tr1b–Tr1m within the memory cells 1B–1M that are not accessed. However, the signal compensator 19 prevents such fault output signal transmitting. The above description explains the case where the memory cell 1A is accessed, however, those of ordinary skilled in the art will appreciate that the leak immune semiconductor memory shown in FIG. 2 is similar any one of the other memory cells 1B–1M is accessed.

In addition, the leak generating transistors Tr31a–Tr31m having the gates of which each area is 1.5 to 3 times as large as the area of each gate of the first transfer transistors Tr1a–Tr1m and the second transfer transistors Tr4a–Tr4m are provided as described above. However, the leak generating transistors Tr31a–Tr31m of which each gate has an area less than 1.5 times or greater than 3 times as large as the area of each gate of the first transfer transistors Tr1a–Tr1m and the second transfer transistors Tr4a–Tr4m are also available as far as the signal compensator 19 serves correctly. Further, providing the leak generating transistors Tr31a–Tr3m of which each gate area is same as the first transfer transistors Tr1a–Tr1m and the second transfer transistors Tr4a–Tr4m and arranging the number of the leak generators 10A–10M to be 1.5–3 times as large or desirably twice as large as the number of the memory cells 1A–1M is an alternative.

Figure 7:
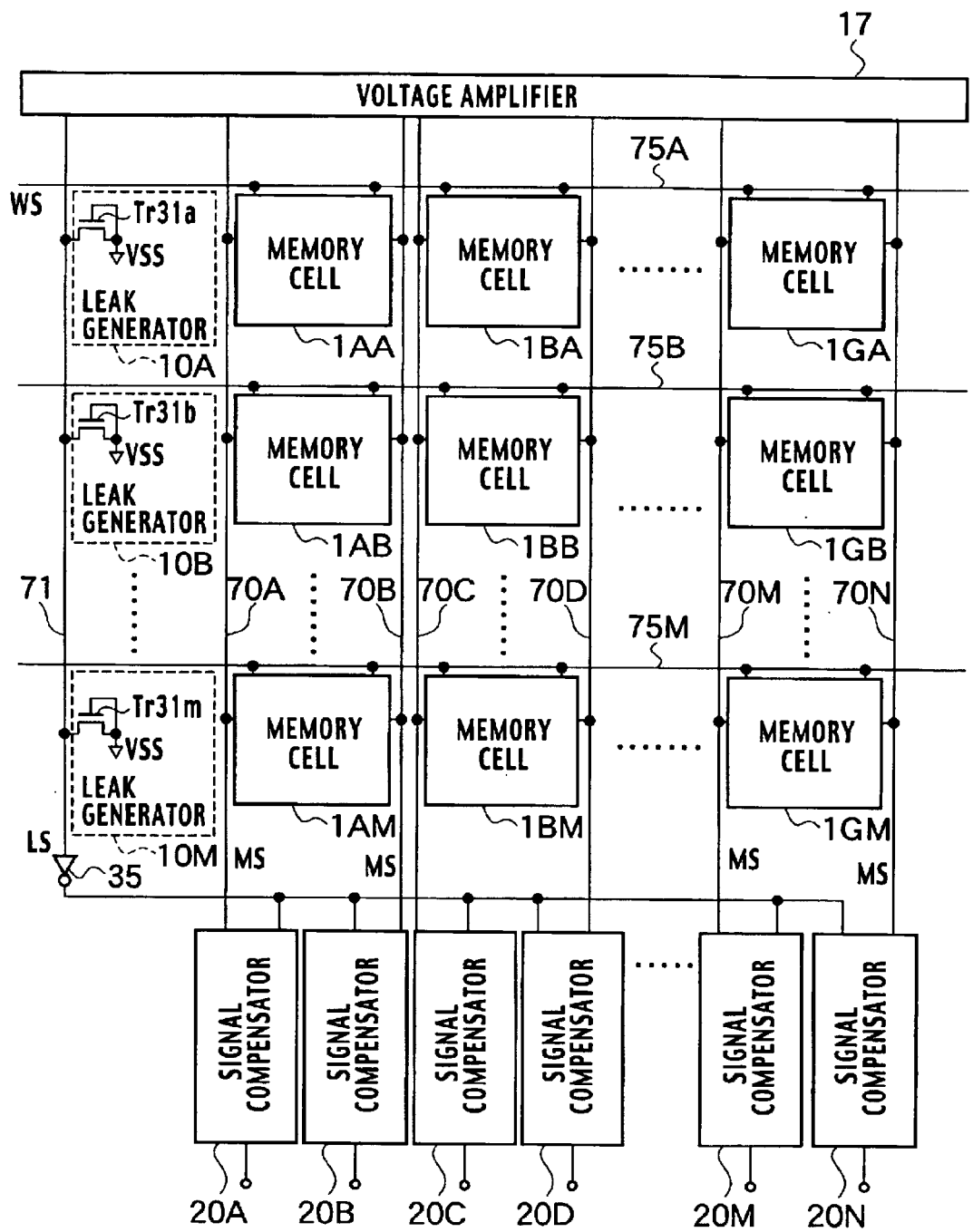
FIG. 7 is an alternative circuit diagram of the leak immune semiconductor memory in accordance with the first embodiment of the present invention.

With reference now to FIG. 7, a diagram of the leak immune semiconductor memory in accordance with the first embodiment provided to a plurality of memory cells 1AA–1GM arranged in a matrix pattern is illustrated. The semiconductor memory shown in FIG. 7 has a first column of memory cells 1AA–1AM through a G column of memory cells 1GA–1GM. Therefore, the leak immune semiconductor memory shown in FIG. 7 has M*G of memory cells 1AA–1GM.

Each of the memory cells 1AA–1GM constitute the SRAM and similar to each of the memory cells 1A–1M shown in FIG. 2. The first column of memory cells 1AA–1AM electrically connect to a bit line 70A and a bit line 70B. The second column of memory cells 1BA–1BM are electrically connected to a bit line 70C and a bit line 70D. Similarly, the G column of memory cells 1GA–1GM are electrically connected to a bit line 70M and a bit line 70N. One end of each of the bit lines 70A–70N is electrically connected to the voltage amplifier 17 and another end of each bit lines 70A–70B is electrically connected to signal compensators 20A through 20N respectively.

The leak detecting line 71 couples the voltage amplifier 17 to a leak detecting inverter 35. A plurality of leak generators 10A through 10M are connected to the leak detecting line 71. An output of the leak detecting inverter 35 is electrically connected to each of the signal compensators 20A–20N.

Figure 8:
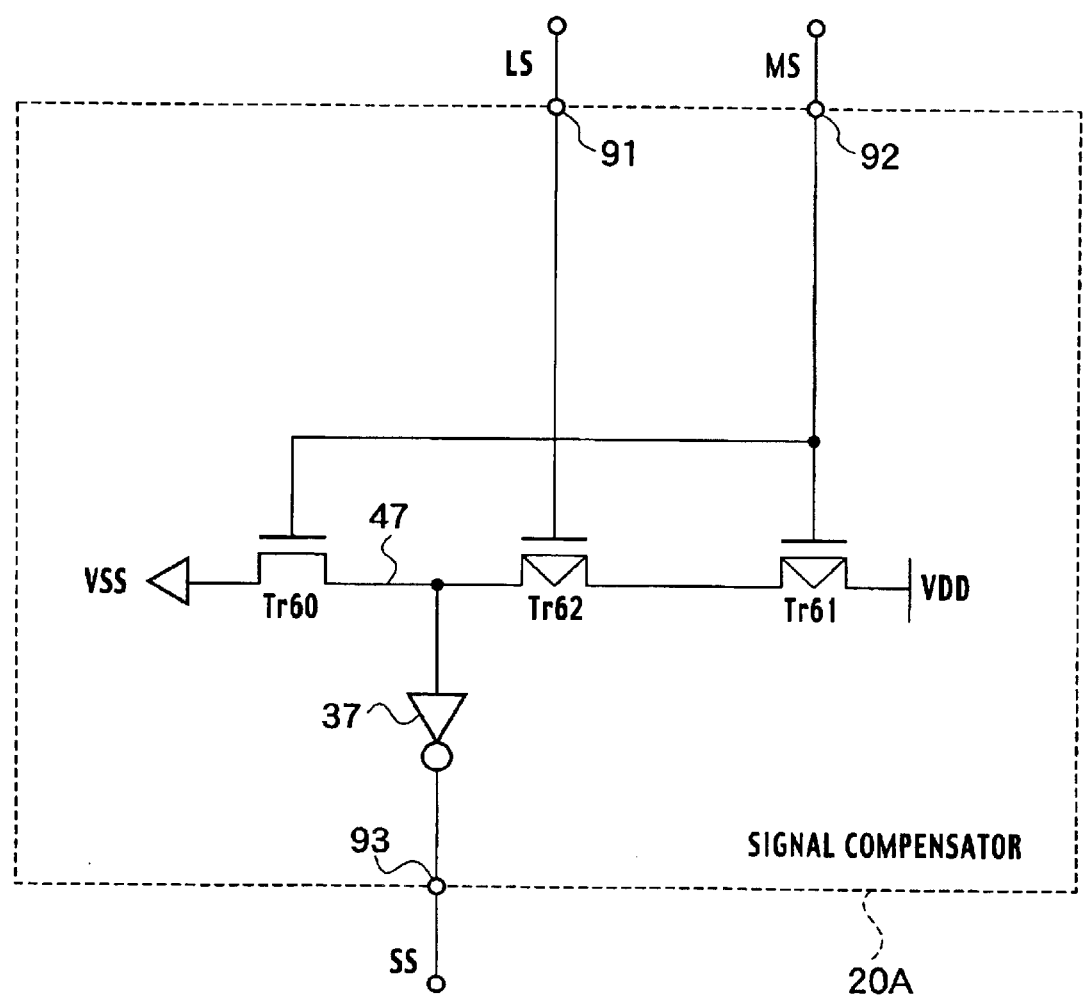
FIG. 8 is an alternative circuit diagram of the signal compensator in accordance with the first embodiment of the present invention.

With reference to FIG. 8, a circuit diagram of the signal compensator 20A schematically shown in FIG. 7 is illustrated. The difference between the signal compensator 20A shown in FIG. 8 and the signal compensator 19 shown in FIG. 3 is that the gate of second channel transistor Tr62 is electrically connected to the input terminal 91 within the signal compensator 20A as shown in FIG. 8. Other elements are arranged similar to the signal compensator 19 shown in FIG. 3. This is because the leak detecting inverter 35 is connected to the end of the leak detecting line 71 as shown in FIG. 7. Each of the other signal compensators 20B–20N has similar circuit. The reason why the leak detecting inverter 35 is connected to an end of the leak detecting line 71 is to set the parasitic capacitance of each of the leak detecting line 71 and the bit lines 70A–70N equal.

The leak immune semiconductor memory shown in FIG. 7 prevents fault signal output caused by the leakage current in the bit lines 70A–70N. The ratio of the leak detecting line 71 to the bit lines 70A–70N ranges from 1:64 to 1:128. Increasing the ratio of the leak detecting line 71 to the bit lines 70A–70N may increase manufacturing costs. In contrast, decreasing the ratio of the leak detecting line 71 to the bit lines 70A–70N may decrease reliability of the leak immune semiconductor memory.

(Second Embodiment)

Figure 9:
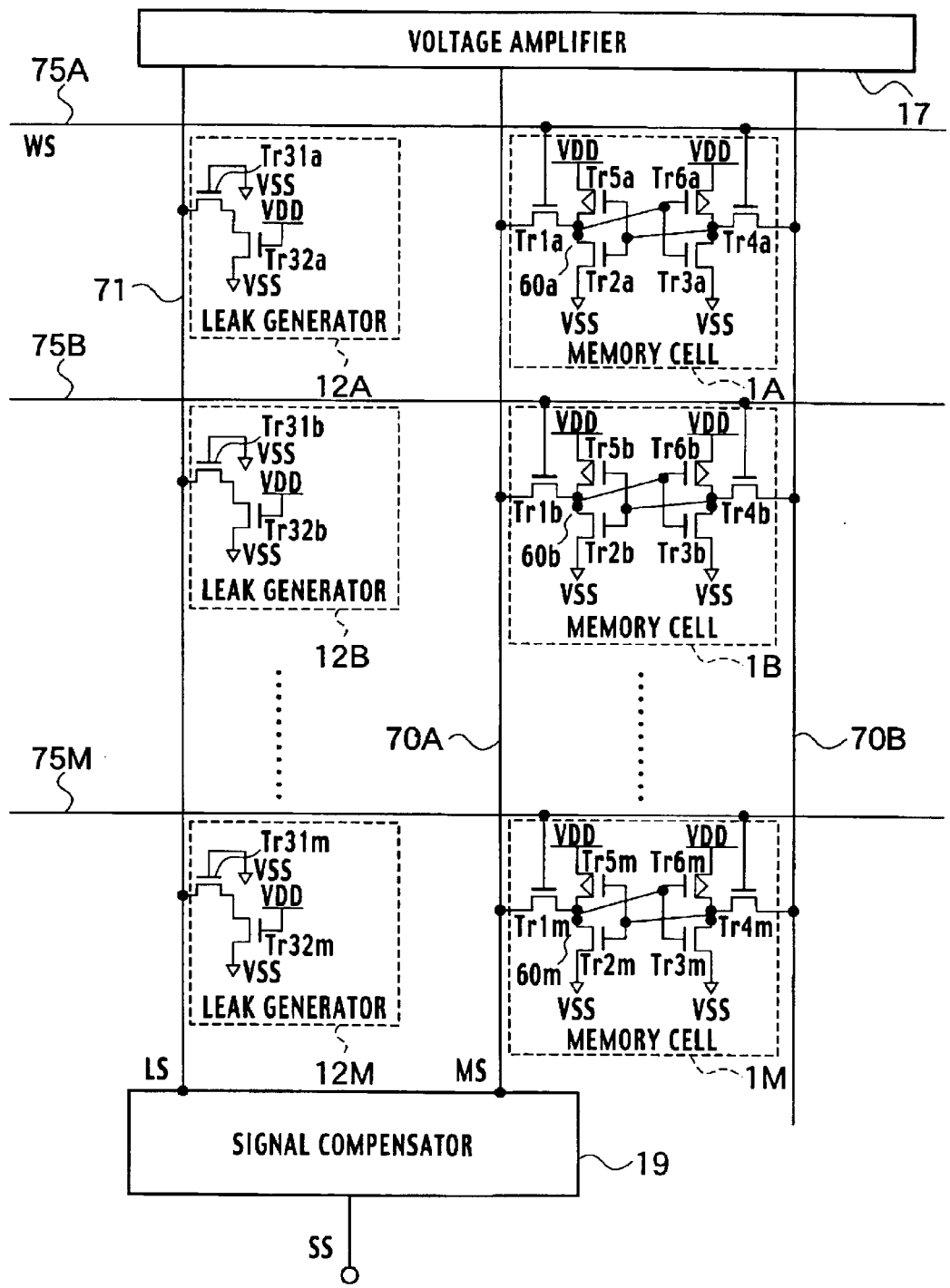
FIG. 9 is a circuit diagram of the leak immune semiconductor memory in accordance with a second embodiment of the present invention.

With reference to FIG. 9, a leak immune semiconductor memory in accordance with a second embodiment of the present invention differs from the leak immune semiconductor memory of the first embodiment shown in FIG. 2 with respect to leak generators 12A through 12M. The leak generators 12A–12M have additional pull down transistors Tr32a through Tr32m connected to the leak generating transistors Tr31a–Tr31m respectively. Each gate of the pull down transistors Tr32a–Tr32m is connected to the high level voltage supply VDD. Therefore, each of the pull down transistors Tr32a–Tr32m is held at the on state and couples each source region of the leak generating transistors Tr31a–Tr31m to the low level voltage supply VSS.

Other elements of the leak immune semiconductor memory shown in FIG. 9 are arranged similar to the leak immune semiconductor memory shown in FIG. 2. In addition, the function in which the signal compensator 19 determines an output signal (SS) before the H level of the memory signal (MS) is pulled down to a negative state by the leakage current in the first bit line 70A is also similar to the leak immune semiconductor memory shown in FIG. 2.

In the leak immune semiconductor memory shown in FIG. 9, the off-state-leakage currents are generated in the leak generating transistors Tr31a–Tr31m under similar condition in which the off-state-leakage currents are generated in the first transfer transistors Tr1a–Tr1m when the memory cells 1A–1M are not accessed and the nodes 60a–60m are in the L level. Therefore, the leak immune semiconductor memory in accordance with the second embodiment prevents the fault output with increased reliability.

(Third Embodiment)

Figure 10:
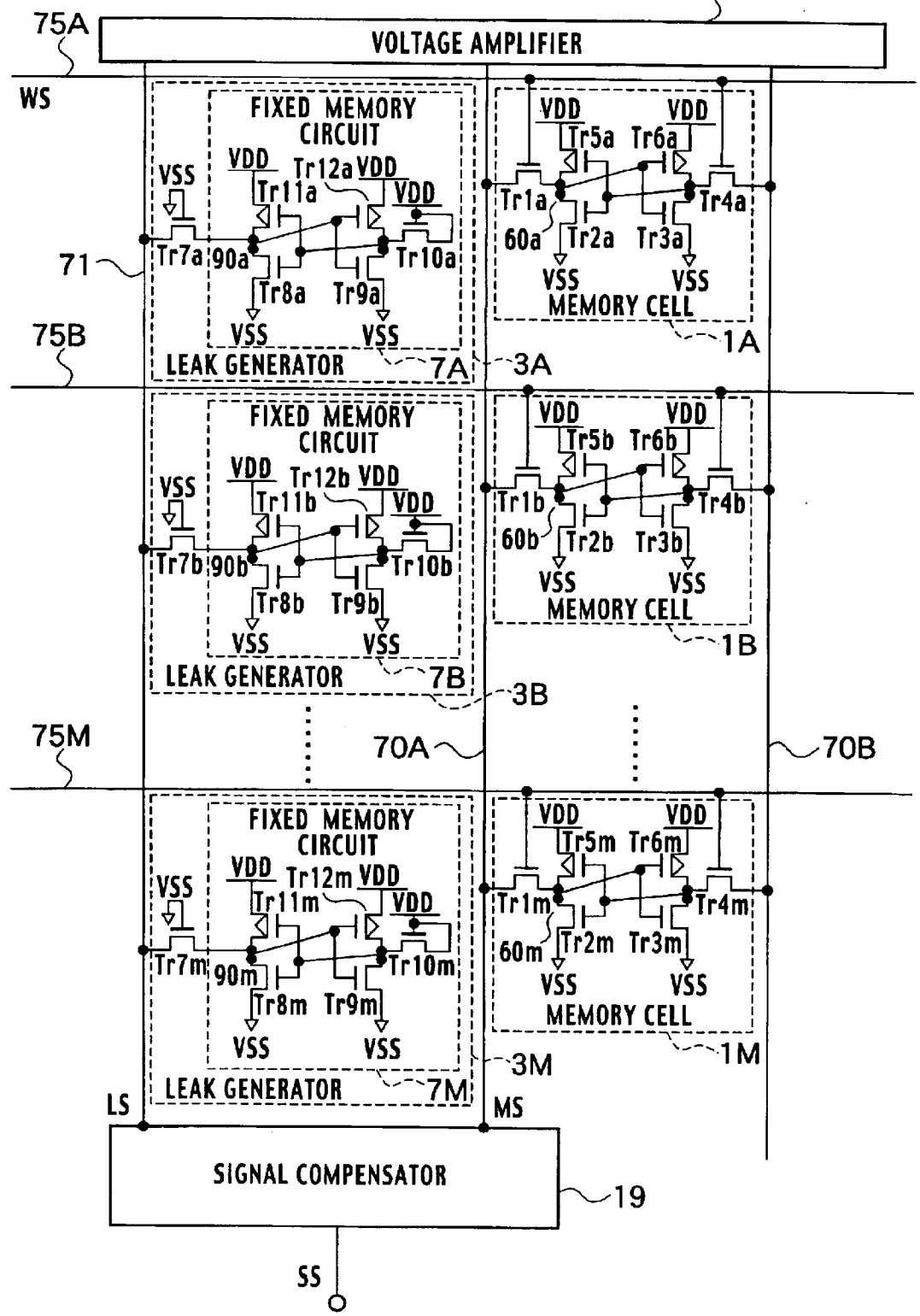
FIG. 10 is a circuit diagram of the leak immune semiconductor memory in accordance with a third embodiment of the present invention.

With reference to FIG. 10, a leak immune semiconductor memory in accordance with a third embodiment of the present invention differs from the leak immune semiconductor memory of the first embodiment shown in FIG. 2 with respect to leak generators 3A through 3M. The leak generators 3A–3M have leak generating transistors Tr7a through Tr7m and fixed memory circuits 7A through 7M that pull the source region of the leak generating transistors Tr7a–Tr7m low states.

The leak generating transistors Tr7a–Tr7m are nMOS transistors. Each drain region of the leak generating transistors Tr7a–Tr7m is electrically connected to the leak detecting line 71. Each gate of leak generating transistors Tr7a–Tr7m is electrically connected to the low level voltage supply VSS. Consequently, each of the leak generating transistors Tr7a–Tr7m is held at the off state. The area of each gate of the leak generating transistors Tr7a–Tr7m is 1.5–3 times or desirably twice as large as the area of each gate of the second transfer transistors Tr4a–Tr4m.

The fixed memory circuits 7A–7M have pull up transistors Tr10a through Tr10m of which each gate and each source region are diode-connected to each other and connected to the high level voltage supply VDD, first fixed load elements Tr11a through Tr11m of which each of the drain regions is electrically connected to each of the source regions of the leak generating transistors Tr7a–Tr7m respectively, first fixed drive-transistors Tr8a through Tr8m of which each of the drain regions is electrically connected to each of the drain region of the first fixed load elements Tr11a–Tr11m respectively, second fixed load elements Tr12a through Tr12m of which each of the drain regions is electrically connected to each of the drain region of the pull up transistors Tr10a–Tr10m respectively, and second fixed drive-transistors Tr9a through Tr9m of which each of the drain regions are electrically connected to each of the drain region of the pull up transistors Tr10a–Tr10m respectively. The pull up transistors Tr10a–Tr10m, the first fixed drive-transistors Tr8a–Tr8m and the second fixed drive-transistors Tr9a–Tr9m are nMOS transistors. On the other hand, the first fixed load elements Tr11a–Tr11m and the second fixed load element Tr12a–Tr12m are pMOS transistors.

In the fixed memory circuit 7A, source regions of the first fixed load element Tr11a and the second fixed load element Tr12a are electrically connected to the high level voltage supply VDD. Source regions of the first fixed drive-transistor Tr8a and the second fixed drive-transistors Tr9a are electrically connected to the low level voltage supply VSS. A gate of the first fixed load element Tr11a and the gate of a first fixed drive-transistor Tr8a are connected to each other and serve as the input of the CMOS inverter. Similarly, a gate of the second fixed load element Tr12a and a gate of the second fixed drive-transistor Tr9a are also connected to each other and serve as the input of the CMOS inverter. The output of the CMOS inverter including the first fixed load element Tr11a and the first fixed drive-transistor Tr8a is electrically connected to the source region of the leak generating transistor Tr7a and also connected to the input of the CMOS inverter including the second fixed load element Tr12a and the second fixed drive-transistor Tr9a. The output of the CMOS inverter including the second fixed load element Tr12a and the second fixed drive-transistor Tr9a is electrically connected to the drain region of the pull up transistor Tr10a and also connected to the input of the CMOS inverter including the first fixed load element Tr11a and the first fixed drive-transistor Tr8a. Each of the other fixed memory circuits 7B–7M is similar to the fixed memory circuit 7A.

In FIG. 10, junctions of the fist fixed load elements Tr11a–Tr11m and the first fixed drive-transistors Tr8a–Tr8m are respectively defined as nodes 90a through 90m. The fixed memory circuits 7A–7M substantially store the "L" level of the memory signal in the nodes 90a–90m. Therefore, the fixed memory circuits 7A–7M substantially pull down the source region of the leak generating transistors Tr7a–Tr7m.

Other elements of the leak immune semiconductor memory shown in FIG. 10 are similar to the leak immune semiconductor memory shown in FIG. 2. The function that the signal compensator 19 shown in FIG. 10 determines the output signal (SS) before the memory signal (MS) is transferred from the "H" level to the "L" level threshold in the first bit line 70A is similar to the leak immune semiconductor memory shown in FIG. 2.

In the leak immune semiconductor memory shown in FIG. 10, the off-state-leakage currents are generated in the leak generating transistors Tr7a–Tr7m within the leak generators 3A–3M under similar condition in that the off-state-leakage currents are generated in the first transfer transistors Tr1a–Tr1m within the memory cells 1A–1M. Therefore, the leak immune semiconductor memory in accordance with the third embodiment prevents the fault output signal transmitting with increased reliability.

(Fourth Embodiment)

Figure 11:
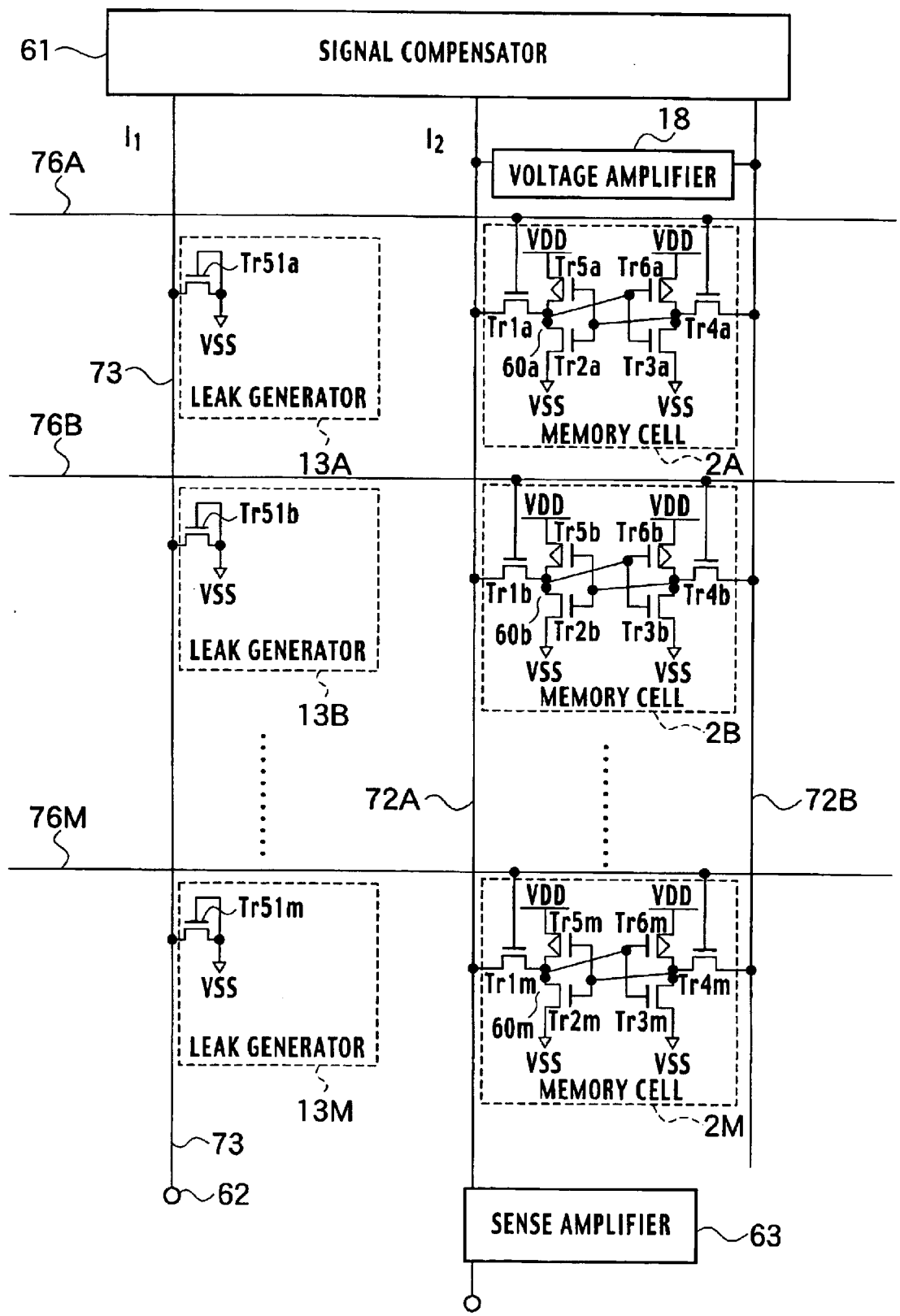
FIG. 11 is a circuit diagram of the leak immune semiconductor memory in accordance with a fourth embodiment of the present invention.

With reference now to FIG. 11, a leak immune semiconductor memory in accordance with a fourth embodiment of the present invention has a plurality of word lines 76A through 76M, a first bit line 72A and a second bit line 72B arranged in a vertical direction to the word lines 76A–76M, a plurality of memory cells 2A through 2M addressed by the word lines 76A–76M respectively to transmit a signal to the first bit line 72A and the second bit line 72B, a leak detecting line 73 arranged parallel to the first bit line 72A, a plurality of leak generators 13A through 13M providing leakage currents to the leak detecting line 73, and a signal compensator 61 detecting a voltage transition of the leak detecting line 73 and changing a voltage of the first bit line 72A.

The leak generators 13A through 13M have leak generating transistors Tr51a through Tr51m respectively. Each source region and each gate of the leak generating transistors Tr51a–Tr51m is diode-connected to each other and connected to the low level voltage supply VSS. Therefore, each of the leak generating transistors Tr51a–Tr51m is held at the off state. Each of the leak generating transistors Tr51a–Tr51m is electrically connected to the leak detecting line 73. The off-state-leakage currents generated in the leak generating transistors Tr51a–Tr51m pull down the leak detecting line to a negative state. The leak detecting line 73 couples the signal compensator 61 to an insulated terminal 62.

The plurality of memory cells 2A–2M are connected to the pair of first bit line 72A and second bit line 72B. Each of the first bit line 72A and the second bit line 72B couples the signal compensator 61 to the sense amplifier 63. Further, a voltage amplifier 18 is connected to the first bit line 72A and the second bit line 72B. The memory cells 2A–2M constitute the SRAM and are similar to the memory cells 1A–1M shown in FIG. 2. The first transfer transistors Tr1a–Tr1m and the second transfer transistors Tr4a–Tr4m within the memory cells 2A–2M are connected to the word lines 76A–76M respectively. The first bit line 72A transfers a signal to the sense amplifier 63. The sense amplifier 63 transmits an amplified signal.

The leak detecting line 73, the first bit line 72A and the second bit line 72B are equivalent in parasitic capacitance. The area of each gate of the leak generating transistors Tr51a–Tr51m is substantially equal to the area of each gate of the first transfer transistors Tr1a–Tr1m and the second transfer transistors Tr4a–Tr4m. In addition, the number of leak generators 13A–13M is substantially equal to the number of memory cells 2A–2M. For example, 256 of the leak generators 13A–13M are connected to the single leak detecting line 73.

Figure 12:
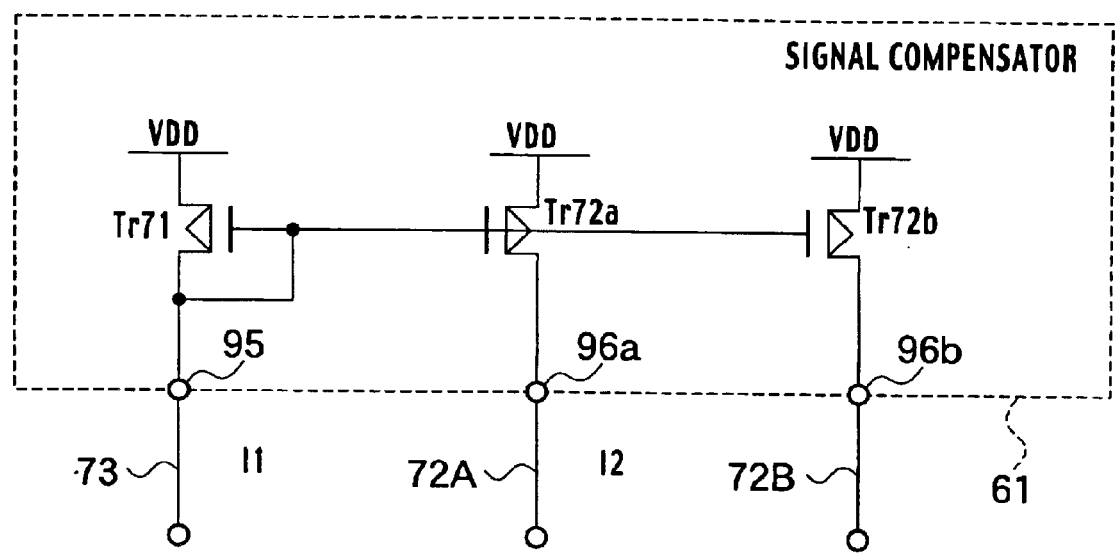
FIG. 12 is a circuit diagram of the signal compensator of the leak immune semiconductor memory in accordance with the fourth embodiment of the present invention.

With reference next to FIG. 12, an example of the signal compensator 61 schematically shown in FIG. 11 is illustrated. The signal compensator 61 has a detecting transistor Tr71 of which the source region is electrically connected to the high level voltage supply VDD and the gate and the drain region are diode-connected, adjusting transistors Tr72a and Tr72b of which each source region is electrically connected to the high level voltage supply VDD and each gate is electrically connected to the gate of the detecting transistor Tr71.

The drain region of detecting transistor Tr71 is connected to a detector terminal 95. The drain regions of the adjusting transistors Tr72a and Tr72b are electrically connected to current output terminals 96a and 96b respectively. The detecting transistor Tr71 and the adjusting transistors Tr72a and Tr72b are pMOS transistors. The signal compensator 61 serves as a current mirror circuit. Therefore, in the case that a leak detecting current I1 is generated in the leak detecting line 73, the signal compensator 61 provides a supplement current I2 to the first bit line 72A. The supplement current I2 is equivalent to the leak detecting current I1.

The principle that the leak immune semiconductor memory shown in FIG. 11 prevents fault signal transmitting in the first bit line 72A is as follows. The case in which the memory cell 2A stores the "H" level signal in the node 60a is described below.

(a) When high voltage is applied to the word line 76A, the first transfer transistor Tr1a within the memory cell 2A goes from the off state to the on state.
(b) The voltage amplifier 18A applies high voltage to the first bit line 72A. In addition, the memory cell 2A transmits the "H" level signal to the first bit line 72A since the first transfer transistor Tr1a is in the on state.
(c) Where the off-state-leakage currents generate in the first transfer transistors Tr1b–Tr1m within the memory cell 2B–2M that are not accessed, the memory cells 2B–2M pull down the first bit line 72A to a negative state.
(d) The leak generators 13A–13M also pull down the leak detecting line 73 to a negative state where the off-state-leakage currents generate in the leak generating transistors Tr51a–Tr51m within the leak generators 13A–13M.
(e) Since the leak generators 13A–13M pull down the leak detecting line 73 to a negative state, the detecting transistor Tr71 within the signal compensator 61 shown in FIG. 12 goes from the off state to the on state. Consequently, the leak detecting current I1 is provided to the leak detecting line 73 shown in FIG. 11. In addition, the adjusting transistor Tr72a shown in FIG. 12 also goes from the off state to the on state. Therefore, the supplement current I2 that is equivalent to the leak detecting current I1 is provided to the first bit line 72A shown in FIG. 11.

As described above, where the off-state-leakage currents generated in the first transfer transistors Tr1b–Tr1m within the memory cells 2B–2M pull down the first bit line 72A to a negative state, the signal compensator 61 provides the first bit line 72A with the supplement current I2. Therefore, the first bit line 72A correctly transmits the "H" level signal received from the memory cell 2A to the sense amplifier 63. Similarly, the first bit line 72A correctly transmits the "H" level signal where each of the other memory cells 2B–2M is accessed. In addition, where the leakage current generates in the second bit line 72B, the signal compensator 61 provides the supplement current.

Coupling the voltage amplifier 18 and the sense amplifier 63 with the first bit line 72A and connecting the signal compensator 61 to the first bit line 72A at any point is an alternative.

Figure 13:
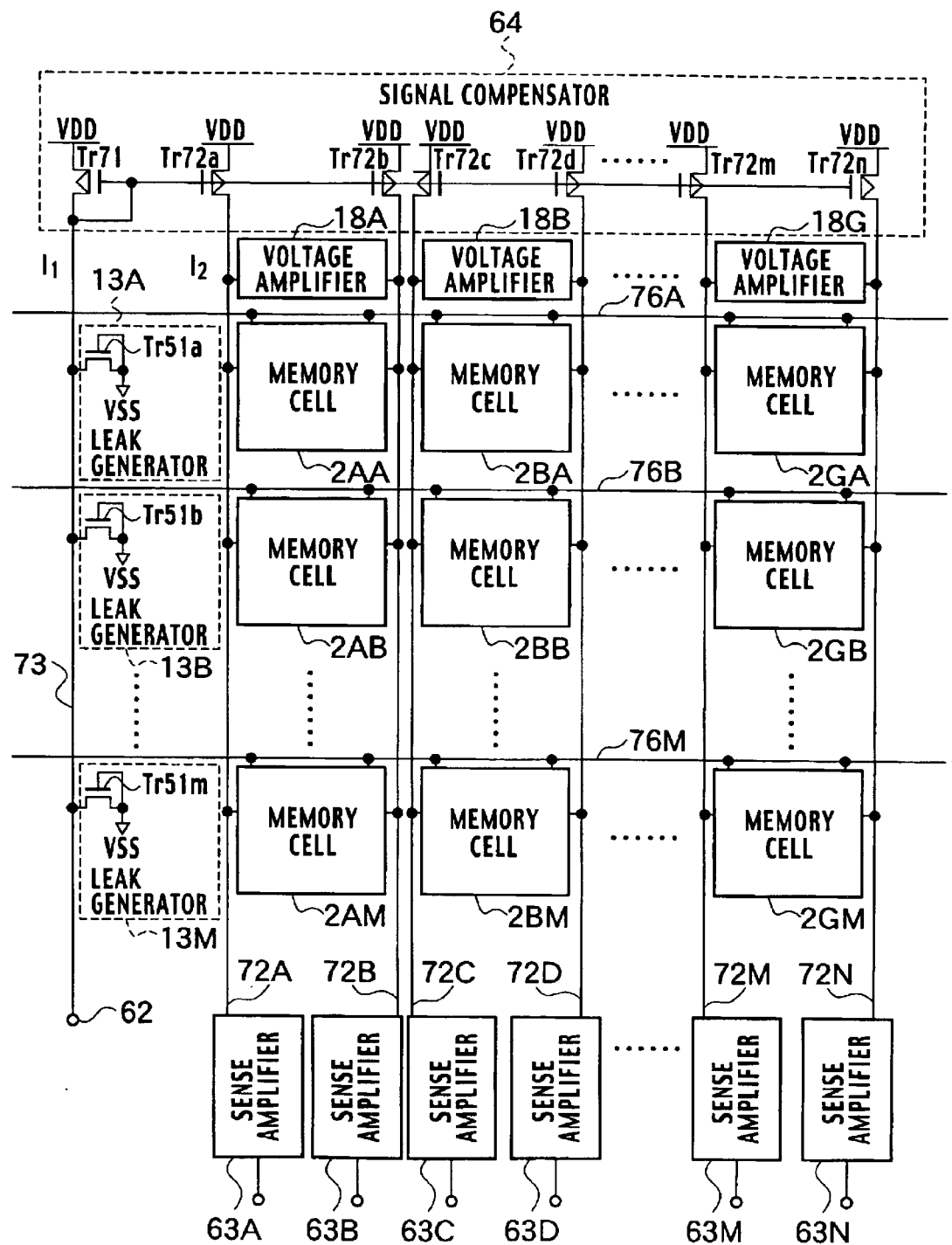
FIG. 13 is an alternative diagram of the leak immune semiconductor memory in accordance with the fourth embodiment of the present invention.

Turning next to FIG. 13, a diagram of the leak immune semiconductor memory in accordance with the fourth embodiment provided to a plurality of memory cells 2AA–2GM arranged in a matrix pattern is illustrated. The leak immune semiconductor memory shown in FIG. 13 has first column of memory cells 2AA–2AM through G column of memory cells 2GA–2BM.

Each of the memory cells 2AA–2GM constitutes the SRAM and is similar to each of the memory cells 2A–2M shown in FIG. 11. The first column of memory cells 2AA–2AM are electrically connected to a bit line 72A and a bit line 72B. The second column of memory cells 2BA–2BM are electrically connected to a bit line 72C and a bit line 72D. Similarly, the G column of memory cells 2GA–2GM are electrically connected to a bit line 72M and a bit line 72N. A voltage amplifier 18A is connected to the bit line 72A and the bit line 72B. A voltage amplifier 18B is connected to the bit line 72C and the bit line 72D. Similarly, a voltage amplifier 18G is connected to the bit line 72M and the bit line 72N. In addition, the signal compensator 64 is connected to an end of each of the bit lines 72A–72N. Each of the other ends of the bit lines 72A–72N is connected to sense amplifiers 63A through 63N respectively.

A plurality of leak generators 13A through 13M are connected to a leak detecting line 73. The leak detecting line 73 couples the signal compensator 64 to the insulated terminal 62. The signal compensator 64 has adjusting transistors Tr72a through Tr72n, that is, as many as the bit lines 72A–72N. The gate of the detecting transistor Tr71 is electrically connected to each gate of the adjusting transistors Tr72a–Tr72n. Each source region of the adjusting transistors Tr72a–Tr72n is electrically connected to the high level voltage supply VDD. The drain regions of the adjusting transistors Tr72a–Tr72n are electrically connected to the bit lines 72A–72N respectively.

Even though the off-state-leakage currents generated in the memory cells 2AA–2GM pull down the bit lines 72A–72N to negative states, the signal compensator 64 provides the bit lines 72A–72N with the supplement current I2 equivalent to the leak detecting current I1 generated in the leak detecting line 73. Therefore, the signal compensator 64 prevents the wrong signal from being transmitted in the bit lines 72A–72N. The single leak detecting line 73 is connected to 64–128 of the bit lines 72A–72N. Arranging single leak detecting line 73 to less 64 bit lines 72A–72N may increase the manufacturing costs. In contrast, connecting single leak detecting line 73 to more than 128 bit lines 72A–72N may decrease reliability of the leak immune semiconductor memory.

(Fifth Embodiment)

Figure 14:
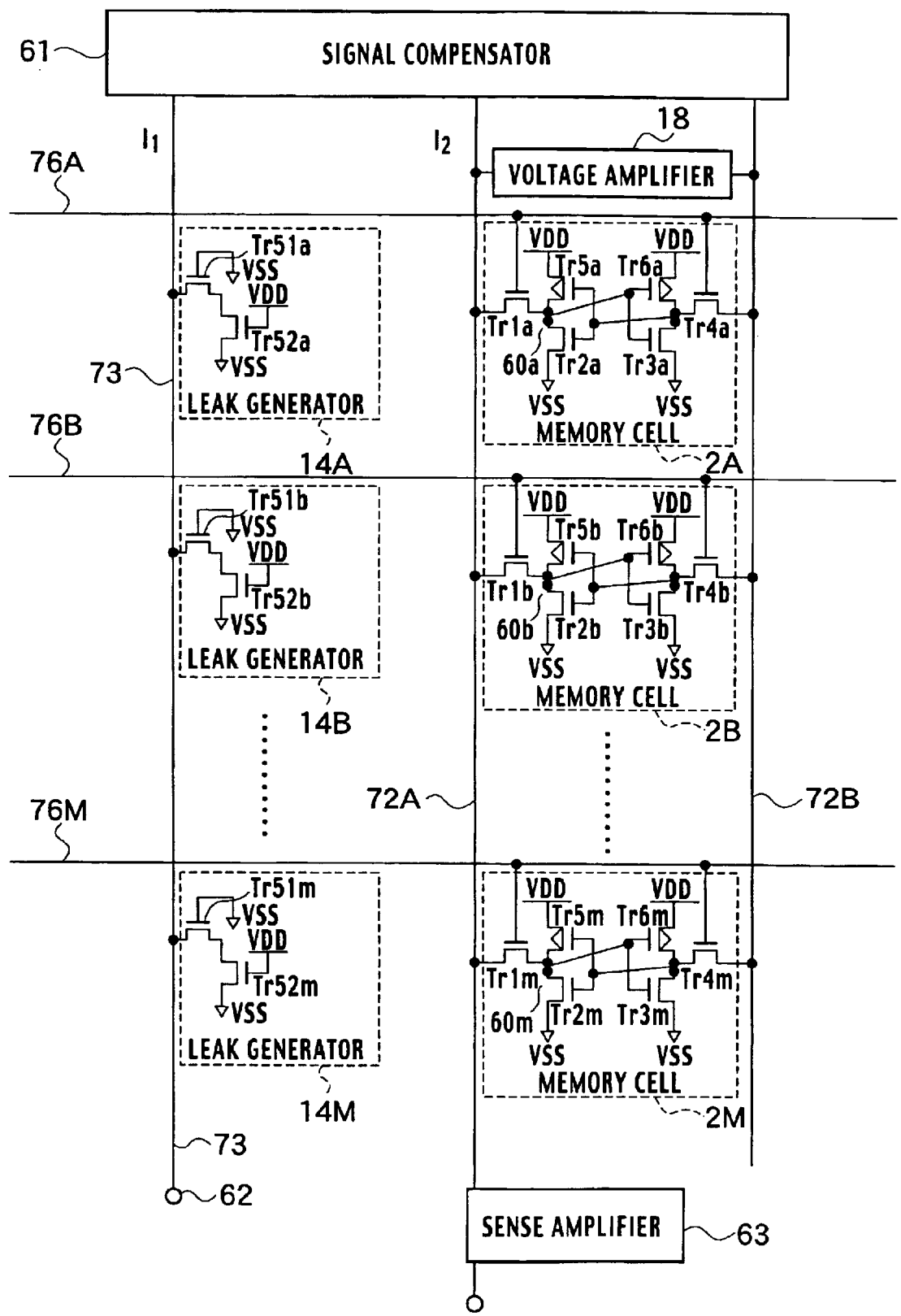
FIG. 14 is a circuit diagram of the leak immune semiconductor memory in accordance with a fifth embodiment of the present invention.

With reference now to FIG. 14, a leak immune semiconductor memory in accordance with a fifth embodiment of the present invention differs from the leak immune semiconductor memory shown in FIG. 11 with respect to leak generators 14A through 14M. The leak generators 14A–14M additionally have pull down transistors Tr52a through Tr52m connected to the leak generating transistor Tr51a–Tr51m respectively. The pull down transistors Tr52a–Tr52m are nMOS transistors. Each gate of the pull down transistors Tr52a–Tr52m is connected to the high level voltage supply VDD. Therefore, each of the pull down transistors Tr52a–Tr52m is held at the on state. Consequently, each of the pull down transistors Tr52a–Tr52m couples each of the source regions of leak generating transistors Tr51a–Tr51m to the low level voltage supply VSS.

Other elements are arranged similar to the leak immune semiconductor memory shown in FIG. 11. In addition, the function that the signal compensator 61 prevents the wrong signal from being transmitted is also similar to the leak immune semiconductor memory shown in FIG. 11.

In the leak immune semiconductor memory shown in FIG. 14, the off-state-leakage currents are generated in the leak generating transistors Tr51a–Tr51m under similar condition in which the off-state-leakage currents are generated in the first transfer transistors Tr1a–Tr1m where the memory cells 1A–1M are not accessed and store the "L" level signals. Therefore, the leak immune semiconductor memory in accordance with the fifth embodiment increases the reliability of preventing the fault output signal transmitting.

(Sixth Embodiment)

Figure 15:
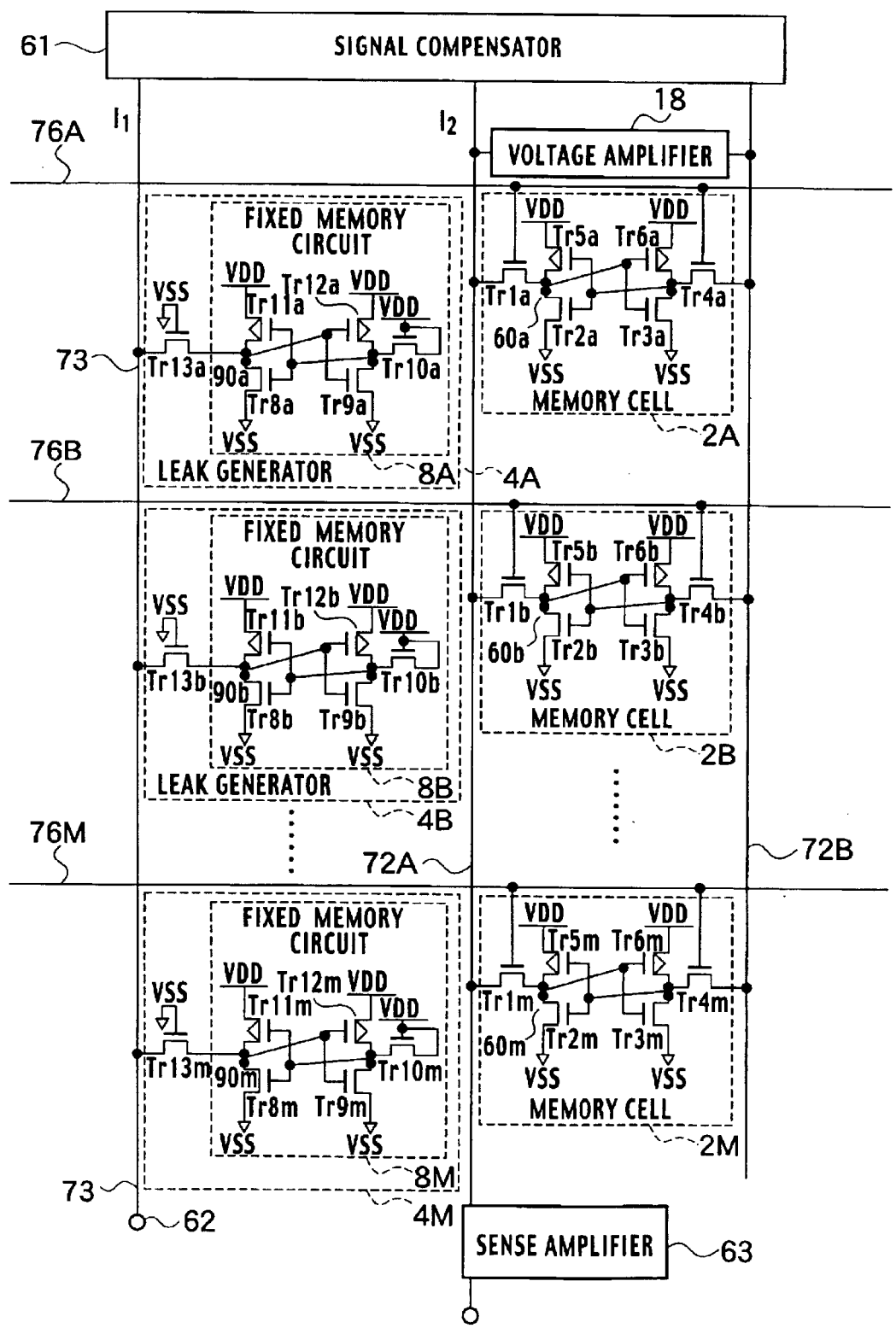
FIG. 15 is a circuit diagram of the leak immune semiconductor memory in accordance with a sixth embodiment of the present invention.

With reference to FIG. 15, a leak immune semiconductor memory in accordance with a sixth embodiment differs from the leak immune semiconductor memory shown in FIG. 11 with respect to leak generators 4A through 4M. The leak generators 4A–4M have leak generating transistors Tr13a through Tr13m and fixed memory circuits 8A through 8M that pull down the source region of the leak generating transistors Tr13a–Tr13m respectively.

The leak generating transistor Tr13a through Tr13m are nMOS transistors. Each drain region of the leak generating transistors Tr13a–Tr13m is electrically connected to the leak detecting line 73. Each gate of the leak generating transistors Tr13a–Tr13m is electrically connected to the low level voltage supply VSS. Therefore, each of the leak generating transistors Tr13a–Tr13m is held at the off state. The area of each gate of the leak generating transistors Tr13a–Tr13m is 1.5–3 times or desirably twice as large as the area of each gate of the first transfer transistors Tr1a–Tr1m.

The fixed memory circuits 8A through 8M are similar to the fixed memory circuits 7A through 7M shown in FIG. 10. The nodes 90a–90m within the fixed memory circuits 8A–8M are electrically connected to the source region of the leak generating transistors Tr13a–Tr13m. The fixed memory circuits 8A–8M pull down the source region of the leak generating transistor Tr13a–Tr13m respectively.

Other circuit elements are similar to the leak immune semiconductor memory shown in FIG. 11. In addition, the function that the signal compensator 61 prevents wrong signal transmission is also similar to the semiconductor memory shown in FIG. 11.

Since the off-state-leakage currents are generated in the leak generating transistor Tr13a–Tr13m within the leak generators 4A–4M under similar condition in which the off-state-leakage currents are generated in the first transfer transistors Tr1a–Tr1m within the memory cells 2A–2M, the leak immune semiconductor memory shown in FIG. 15 prevents transmission of the fault output signal with increased reliability.

(Other Embodiments)

Various modifications will become possible for those skilled in the art after receiving the teaching of the present disclosure without departing from the scope thereof.

Thus, the present invention of course includes various embodiments and modifications and the like which are not detailed above. Therefore, the scope of the present invention will be defined in the following claims.

What is claimed is:

1. A semiconductor memory comprising:
    a plurality of word lines;
    a plurality of bit lines arranged perpendicular to the word lines;
    a plurality of memory cells arranged in a matrix corresponding to a plurality of cross points of the word lines and the bit lines, and configured to store signals by transition states of transistors, and configured to provide the bit lines with the signals addressed by the word lines;
    a leak detecting line arranged parallel to the bit lines;
    a plurality of leak generators configured to provide the leak detecting line with a leakage current; and
    a signal compensator configured to detect a potential of the leak detecting line, and to change the signals transmitted by the bit lines.

2. The semiconductor memory of claim 1, wherein the bit lines includes first and second bit lines.

3. The semiconductor memory of claim 2, wherein each of the memory cells comprises:
    a first transfer transistor having a drain region electrically connected to the first bit line and a gate electrically connected to each of the word lines;
    a second transfer transistor having a drain region electrically connected to the second bit line and a gate electrically connected to each of the word lines;
    a first load element having one end electrically connected to a high level voltage supply and another end electrically connected to a source region of the first transfer transistor;
    a second load element having one end electrically connected to the high level voltage supply and another end electrically connected to a source region of the second transfer transistor;
    a first drive-transistor having a drain region electrically connected to the source region of the first transfer transistor and a gate electrically connected to the source region of the second transfer transistor and a source region electrically connected to a low level voltage supply; and
    a second drive-transistor having a drain region electrically connected to the source region of the second transfer transistor and a gate electrically connected to the source region of the first transfer transistor and a source region electrically connected to the low level voltage supply.

4. The semiconductor memory of claim 3, wherein each of the leak generators comprises a leak generating transistor having a drain region electrically connected to the leak detecting line and held at an off state.

5. The semiconductor memory of claim 4, wherein a gate and a source region of the leak generating transistor are electrically connected to the low level voltage supply.

6. The semiconductor memory of claim 4, wherein each of the leak generators further comprises a pull down transistor held at an on state, and configured to couple a source region of the leak generating transistor to the low level voltage supply.

7. The semiconductor memory of claim 4, wherein each of the leak generators further comprises a fixed memory circuit configured to pull a source region of the leak generating transistor to a low state.

8. The semiconductor memory of claim 1, wherein the signal compensator comprises:
    a first inverter configured to receive a leak signal transmitted by the leak detecting line;
    a first switching transistor having a source region electrically connected to a high level voltage supply, and controlled by a memory signal transmitted by each of the bit lines;
    a second switching transistor having a source region electrically connected to a drain region of the first switching transistor, and controlled by a signal transmitted by the first inverter;
    a third switching transistor having a drain region electrically connected to a drain region of the second switching transistor and a source region electrically connected to a low level voltage supply, and controlled by the memory signal; and
    a second inverter electrically connected to the drain region of the third switching transistor.

9. The semiconductor memory of claim 4, wherein a gate threshold voltage of the leak generating transistor is lower than a gate threshold voltage of the first transfer transistor.

10. The semiconductor memory of claim 1, wherein the number of the leak generators is equal to the number of the memory cells arranged in a single column.

11. The semiconductor memory of claim 1, wherein the signal compensator comprises:

a detecting transistor having a source region electrically connected to a high level voltage supply, and a gate and a drain region are electrically connected to the leak detecting line; and a plurality of adjusting transistors having source regions electrically connected to the high level voltage supply, and gates electrically connected to the gate of the detecting transistor, and having drain regions electrically connected to the bit lines respectively.

* * * * *